(12) United States Patent
Mitschang

(10) Patent No.: US 7,275,010 B2
(45) Date of Patent: Sep. 25, 2007

(54) METHOD FOR CALCULATING FREQUENCY AND AMPLITUDE MODULATION FOR ADIABATIC ELECTRO MAGNETIC PULSES

(75) Inventor: Lorenz Mitschang, Ramstein-Miesenbach (DE)

(73) Assignee: Bundesrepublik Deutschland, vertreten dirch das Bundes-ministerium für Wirtschaft und Arbeit, dieses vertreten durch den Präsidenten der Physikalisch-Technischen Bundesanstalt, Braunschweig (DE)

( * ) Notice: Subject to any disclaimer, the term of this patent is extended or adjusted under 35 U.S.C. 154(b) by 217 days.

(21) Appl. No.: 10/471,654

(22) PCT Filed: Mar. 14, 2002

(86) PCT No.: PCT/DE02/00911

§ 371 (c)(1), (2), (4) Date: Apr. 15, 2004

(87) PCT Pub. No.: WO02/073229

PCT Pub. Date: Sep. 19, 2002

(65) Prior Publication Data

US 2004/0167751 A1 Aug. 26, 2004

(30) Foreign Application Priority Data

Mar. 14, 2001 (DE) ................ 101 12 625

(51) Int. Cl.
*H03F 1/26* (2006.01)

(52) U.S. Cl. .............. 702/127; 702/189; 324/300

(58) Field of Classification Search ............... 702/57, 702/189, 198, 127; 324/300, 307, 309, 313, 324/314
See application file for complete search history.

(56) References Cited

U.S. PATENT DOCUMENTS

| 4,988,947 A | * | 1/1991 | Ugurbil et al. | 324/307 |
| 6,094,049 A | * | 7/2000 | Rosenfeld et al. | 324/307 |
| 6,448,769 B1 | * | 9/2002 | Rosenfeld et al. | 324/307 |

OTHER PUBLICATIONS

B. Shore, The Theory of Coherent Atomic Excitation, John Wiley, New York, 1990, p. 303.
C.J. Hard, W.A. Edelstein and D. Vatis, Journal of Magnetic Resonance 66, 470, 1986.
A. Tannus and M. Garwood, Journal of Magnetic Resonance A 120. 133, 1996.

(Continued)

*Primary Examiner*—Manuel L. Barbee
(74) *Attorney, Agent, or Firm*—Whitham, Curtis, Christofferson & Cook, P

(57) ABSTRACT

The invention relates to a method for calculating parameters of frequency and/or amplitude modulated electromagnetic pulses for adiabatic transfer processes in a quantum mechanical system with the dynamics of the quantum mechanic system described by a Hamilton Operator (H(t)) in a current system of coordinates. The inventive method consists of the following steps:
a) transformation of the Hamilton Operator (H(t)) of a current system of coordinates into a subsequent system of coordinates for describing the time dependency of the change in direction of the Hamilton Operator (H(t));
b) determination of the self-commutation of the Hamilton Operator (H(t)) at a time t and the Hamilton Operator (H(t')) at a time t' in the corresponding system of coordinates, whereby a differential equation system is obtained;
c) calculation of the parameters from the differential equation system thus obtained.

22 Claims, 7 Drawing Sheets

OTHER PUBLICATIONS

D. Rosenfield and Y. Zur, Magnetic Resonance in Medicin 36, 124, 1996.
PCT WO 99/35509.
F.Bloch and A.J. Seigert, Physical Review 57, 522, 1940.
M. Garwood and K. Ugurbil in NMR, Basic principals and progress, vol. 26, Springer-Velag, Heidelberg, 1992, p. 109.
S. Hediger, B.H. Meier, N.D. Kurur, G. Bodenhausen and R.R. Ernst in Chemical Physics Letters 223,283, 1994.
C.E. Hughes, R. Kemp-Harper and S. Wimperis, Journal of Chemical Physics, 108, 879, 1998.
Z. Starcuk, K. Bartusek, Journal of Magnetic Resonance A 107, 24 1994.
E. Kupee, R. Schmidt, R. Rance and G. Wagner, Journal of Magnetic Resonance 135, 361, 1998.
W.S. Warren, H. Rabitz and M. Dahleh, Science 259, 1581, Physics 70, 1003, 1998.
K. Bergmann , H, Theuer and B.W. Shore, Review of Modern Physics 70, 1003, 1998.
J. Orek, F.P. Hioe and J.H. Eberly, Physical Review A 29, 690, 1984.
U. Gaubatz, P. Rudecki, S. Schiemann and K. Bergmann, Journal of Chemical Physics 92, 5363, 1990.
M.B. Plenio and P.L. Knight, Physical Review A 53, 2986 1996.
T.R. Eykyn et al. "Single-Transition Coherence Transfer by Adiabatic Cross Polirizatin in NMR" XP-002203689.

* cited by examiner

METHOD FOR CALCULATING FREQUENCY AND AMPLITUDE MODULATION FOR ADIABATIC ELECTRO MAGNETIC PULSES

BACKGROUND OF THE INVENTION

1. Field of the Invention

The invention relates to a method for calculation of parameters for frequency-modulated and/or amplitude-modulated electromagnetic pulses for adiabatic transfer processes in a quantum-mechanical system, with the dynamic processes in the quantum-mechanical system being described by a Hamilton operator H(t) in an instantaneous coordinate system.

2. Background Description

The magnetism of the material is based on magnetic moments $\vec{m}$ of elementary particles of which the material is composed, in which the magnetic moments can interact with an external magnetic field. When the external magnetic field is static, the magnetic moments carry out a precession movement. The precession frequency of the magnetic moments depends on the magnetic field strength. If a magnetic alternating field is now also applied in addition to the static magnetic field, at a frequency which is matched to the precession frequency of the magnetic moments, a resonant absorption of energy from the magnetic alternating field occurs. All phenomena which are subsumed by the expression "magnetic resonance" are based on this principle.

The reason for the magnetic moments of the elementary particles is their total angular momentum, which includes the spin as a quantum-mechanical variable. The theoretical treatment of magnetic resonance is thus based on quantum mechanics. The dynamic response of a quantum-mechanical system is described by what is referred to as the Hamilton operator H, which is included in what is referred to as the Schrödinger equation. The Schrödinger equation is an equation of motion for the state vector which describes the state of a quantum-mechanical system. For a definition of the Schrödinger equation and of the Hamilton operator, reference shall be made to the Lexikon der Physik [Dictionary of Physics], Volumes 3 and 5, Spektrum Akademischer Verlag, Heidelberg, 2000.

Frequency-modulated and amplitude-modulated electromagnetic pulses are used for adiabatic polarization and coherence transfer in atomic and molecular spectroscopy (laser optics, magnetic resonance) and in imaging processes (magnetic resonance tomography, magnetic resonance imaging). One problem which occurs in trials is the random interaction between the elementary particles, and this leads to relaxation processes which force the system back to the equilibrium state after a deflection. Secondly, theoretically fixed values are assumed for the system variables, such as the transition frequency, field amplitude etc. even though these variables may be subject to fluctuations, or their values may not be sufficiently well known, in a macroscopic sample.

Adiabatic techniques are therefore used, and are particularly advantageous when a spectroscopic parameter has a broad bandwidth (variation in the intensity of the molecular coupling, distribution of transition frequencies produced by field gradients), or when the aim is to avoid a difficult adjustment (homogeneity of external fields).

The pulse shapes and parameters of the frequency-modulated and/or amplitude-modulated electromagnetic pulses are conventionally determined empirically. A successful pulse shape, satisfies what is referred to as the adiabatic condition, which is required as a control criterion in this case. This adiabatic condition is a criterion in the form of an inequality for what is referred to as the adiabatic approximation, and can be formulated in various ways. If, for example, the square of the magnitude of the quotient of the maximum angular velocity of an eigen state (energy level) and of the minimum transition frequency to an adjacent eigen state (energy level) is very much smaller than unity $$\left(\left|\frac{\alpha^{max}}{\omega^{min}}\right|^2 \ll 1\right),$$

the adiabatic approximation is regarded as being valid. The expression adiabatic, that is to say the dynamic response in the sense of the adiabatic approximation, is defined by Ehrenfest such that the change in the system during the action of the electromagnetic field is so slow that the change in the energy level is negligibly small. In other words, in the situation under consideration of the magnetic moments, the magnetization follows the magnetic field, provided that the field direction changes sufficiently slowly.

The sudden and adiabatic change in the Hamilton operator is explained theoretically in detail in Albert Messiah, Quantenmechanik [Quantum mechanics], Volume 2, 2nd edition, Walter De Gruyter, Berlin, N.Y. 1985, Chapter 17.2, pages 223 to 236.

The adiabatic approximation corresponds to a simplification in the description of the dynamic response of the system, by ignoring any coupling between a radiation field and the system that is caused by variation with time of the carrier frequency, and of the amplitude. The dynamic response is then approximately stationary, that is to say it is assumed that the carrier frequency and the amplitude of the input radiation do not vary with time, but that their instantaneous values are constant. The adiabatic condition can always be satisfied for a given pulse shape if the rate of change of the modulation functions is made sufficiently small. However, this correspondingly lengthens the duration of the desired polarization or coherence transfer. B. Shore, The Theory of Coherent Atomic Excitation, John Wiley, New York 1990, page 303, discloses the determination of pulse shapes from the need to obtain analytical solutions to the equation of motion, with the adiabatic dynamic response being achieved only in a second step by slowing down the modulation processes and hence the desired transfer.

In other approaches, the adiabatic condition is transformed from the form of an inequality, which is not suitable for calculation of modulation functions, to the form of an equation with the assistance of further physical assumptions. This can be regarded as a conditional equation in the sought functions and allows them to be determined, possibly with the assistance of secondary conditions. Once again, the rate of change of the modulation functions must be determined empirically in order to lie in the validity range of the adiabatic approximation. These approaches are described, for example, in C. J. Hardy, W. A. Edelstein and D. Vatis, Journal of Magnetic Resonance 66, 470, 1986;

A. Tannus and M. Garwood, Journal of Magnetic Resonance A 120, 133, 1996; and

D. Rosenfeld and Y. Zur, Magnetic Resonance in Medicine 36, 124, 1996.

Pulse shapes for the two-level system (spin ½) are typically developed, in which there are no internal interactions and the dynamic response is governed exclusively by the applied radiation, and hence can be controlled completely.

The conventional determination of pulse shapes for adiabatic polarization and coherence transfers have the following disadvantages:

The semi-empirical methods do not take account of the relaxation processes to which the system is subject. A successful adiabatic transfer has to take place in a shorter time than that in which the system relaxes significantly. It is thus desirable to use fast modulations. However, this contradicts the fundamental adiabatic approximation. Optimum pulse shapes for the fastest possible transfer must therefore be found in the context of the adiabatic condition. However, the adiabatic condition, as an inequality, defines only a relatively broad frame for this object. It is thus difficult to determine pulse shapes which carry out a desired adiabatic transfer virtually optimally, that is to say in a very short time over a given parameter bandwidth. Conventionally, attempts have thus been made to optimize the parameters for frequency-modulated and/or amplitude-modulated electromagnetic pulses for adiabatic transfer processes by experiments. This complex procedure need not necessarily, be successful which leads to a comparatively reduced signal-to-noise ratio. In the case of systems which relax sufficiently quickly, adiabatic techniques may not be used at the moment.

In addition to the relaxation-dependent losses, what are referred to as diabatic losses occur as a consequence of an imperfect adiabatic transfer. These are caused by the coupling that has been ignored, since the actual dynamic response of the system is not the same as the theoretical dynamic response as assumed for the adiabatic approximation. The magnitude of the diabatic losses is governed by the quality of the adiabatic condition. The diabatic losses increase as the transfer processes become faster.

For inherently time-dependent systems in which time-dependent interactions occur even without any input radiation, it is very difficult to find any suitable pulse shapes whatsoever for induction of an adiabatic dynamic response.

In addition, there are no pulse shapes which have been developed especially for adiabatic polarization and coherence transfers in multi-level systems, possibly with internal interactions. Processes such as these have until now been carried out using modulation functions which were determined for a two-level system.

WO 99/355 09 describes a method for calculation of parameters for frequency-modulated and/or amplitude-modulated pulses. The principle is to find a matching velocity profile for a given trajectory, such that the corresponding pulse induces an adiabatic dynamic response in a coordinate system other than a rotating coordinate system. In this case, known trajectories are copied from a rotating coordinate system to the relevant different coordinate system, and the velocity profiles are optimized numerically.

The two variables sought for definition of a pulse, namely the frequency modulation and amplitude modulation as a function of time, can, finally, be calculated uniquely from the variables determined in this way, from the trajectory and from the velocity profile. However, this has the disadvantage that new pulse shapes must be assumed and investigated empirically. Furthermore, the trajectory and velocity profile reflect local (infinitesimal) characteristics of the resultant pulse. Both variables are also used in order to satisfy an adiabatic condition in the sense of the adiabatic approximation—that is to say ignoring interactions—in a coordinate system other than a rotating coordinate system.

SUMMARY OF THE INVENTION

The object of the invention was to provide a method for calculation of parameters for frequency-modulated and/or amplitude-modulated electromagnetic pulses for adiabatic transfer processes in a quantum-mechanical system, by means of which optimized pulses are obtained which allow fast adiabatic transfer without any significant diabatic losses.

The object is achieved by the following steps:
 a) transformation of the Hamilton operator H(t) from an instantaneous coordinate system to a subsequent coordinate system in order to describe the time dependency of the direction change of the Hamilton operator H(t);
 b) determination of the self-commutation of the Hamilton operator H(t) with respect to the time t and of the Hamilton operator H(t') with respect to the time t' in the respective coordinate system, with a differential equation system being produced;
 c) calculation of the parameters from the differential equation system which is produced.

According to the invention, the method is based on an exact description of the system dynamic response to frequency-modulated and amplitude-modulated radiation, so that there is no need for any approximate analysis in the sense of the adiabatic approximation. The pulse shapes obtained may even contravene the conventional adiabatic approximation, but can be used by the fundamental method. Adiabatic transfer processes can therefore be achieved in a shorter time than is conventionally possible. The pulses obtained may thus also be used for systems which relax relatively quickly.

The Hamilton operator for the two-level system (spin ½) is, for example:

$$H_0(t) = \Delta_0(t)I_z + \omega_0(t)I_x = a_0(t)\{\cos\theta_0(t)I_z + \sin\theta_0(t)I_x\}$$

where, in the following text $I_z$, $I_x$ and $I_y$, are the components of the angular momentum of the spin ½ on a defined Z, X and Y axis of the rotating coordinate system (rotating wave approximation for linearly polarized radiation). The Hamilton operator H(t) is thus in the form of a vector (in Liouvill space). The resonance offset $\Delta_0(t)$ defines the internal energy of the system in the rotating system, and the field amplitude $\omega_0(t)$ defines the coupling strength between the two energy levels. An arbitrary radiation initial phase is set to zero instead of the Cartesian coordinates $\Delta_0(t)$ and $\omega_0(t)$, $H_0(t)$ can also be represented by means of polar coordinates of an effective field $a_0(t) = \sqrt{\Delta_0(t)^2 + \omega_0(t)^2}$ and rotation angle $$\theta_0(t) = \arctan\left\{\frac{\omega_0(t)}{\Delta_0(t)}\right\}.$$

The time dependency of the direction change of the Hamilton operator $H_0(t)$ can be described by transformation from the instantaneous rotating coordinate system to a subsequent coordinate system whose Z axis in each case points along the effective field in the rotating coordinate system, and whose Y axis matches that of the rotating coordinate system. The X, Y and Z axes form an orthogonal system. In the new coordinate system, whose index is 1, the Hamilton operator is $$H_1(t) = a_0(t)I_z - \dot\theta_0(t)I_y$$

where $$\overset{*}{\theta}_0(t) = \frac{d\theta_0(t)}{dt}.$$

The product $\dot{\theta}_0(t)I_y$ is the fictitious field as an angular momentum, which produces the reorientation of the Hamilton operator in the previous, rotating coordinate system.

In contrast to the conventional adiabatic approximation, this fictitious field is no longer ignored. The self-commutation of the Hamilton operator H(t) with respect to the time t and H(t') with respect to the time t' is determined by:

$$[H(t),H(t')]=H_1(t)\cdot H_1(t')-H_1(t')\cdot H_1(t)=0, \text{ where } \forall t, t'>0$$

and a differential equation system is calculated from this condition, which is referred to in the following text as the exact adiabatic condition. This differential equation system which is produced can then be used to determine the desired parameters in a known manner by solving this differential equation system.

Steps a) is preferably carried out iteratively, with the transformation from the instantaneous coordinate system to a subsequent coordinate system being covered by the rotation angle θ, which describes the change in the direction of the Hamilton operator H(t), that is to say between the Z axis of the instantaneous coordinate system and the Hamilton operator H(t).

With conventional pulse designs in a rotating coordinate system, the requirement (which is equivalent to self-commutation) for constancy of the adiabatic parameter leads, as is known, to rather unuseful results. Surprisingly, and in contrast, it has been found with the iterative analytical method according to the invention that the adiabaticity is improved with each iteration step, that is to say the self-commutation in a subsequent coordinate system. This is the result of the satisfaction of an exact adiabatic condition in the sense that no interactions are ignored. It is thus possible to find optimized pulses. Furthermore, secondary conditions can be defined freely—in particular independently of the aim of improved adiabaticity, which is forced by the self-commutation itself. The secondary conditions also allow desired global characteristics of the pulses to be achieved easily.

This results in a large number of differential equations being produced. The self-commutation can be determined by calculation of the matrix equation $$[H_i(t),H_i(t')]=H_i(t)\cdot H_i(t')-H_i(t')\cdot H_i(t)=0$$

where i is the integer sequential number of the corresponding coordinate system, t is the time and t' is a time other than t, when t and t' are greater than 0.

This is equivalent to the condition $\dot{\eta}_{i-1}=\tan(\theta_i)a_{i-1}(t)$, where $\theta_i$ is assumed to be constant. The self-commutation is thus determined by assuming that there is a constant ratio over the time t between the angular velocity and the magnitude (length) of the Hamilton operator H(t) in the previous coordinate system, that is to say the (i−1)th coordinate system in accordance with the condition $$\frac{\overset{*}{\theta}_{i-1}(t)}{a_{i-1}(t)} = \text{constant.}$$

The constant is the tangent of the rotation angle θ in the instantaneous coordinate system, that is to say the i-th coordinate system. The method according to the invention is based on the knowledge that, analogously to the situation described above in the rotating coordinate system, the Hamilton operator $H_i(t)$ defines an effective field in the i-th coordinate system with the amplitude $a_i(t)=[a_{i-1}(t)^2+\dot{\theta}^{i-1}(t)^2]^{1/2}$ and an offset angle $\theta_i$ relative to the Z axis in the i-th coordinate system. If frequency-modulated and amplitude-modulated functions $\Delta_i(t)$ and $\omega_i(t)$ (the index i is the number of the solution with respect to the self-commutation condition in the i-th coordinate system), such that the self-commutation condition $\dot{\theta}_{i-1}=\tan(\theta_i)\,a_{i-1}(t)$, where $\theta_i$=constant is satisfied, are determined and used then $a_{i-1}(t)$ and $\dot{\theta}_{j-1}(t)$ may vary although their ratio $\tan\theta_i$ and hence the angle $\theta_i$ do not vary with time. The system thus remains in the eigen state relative to the i-th coordinate system over time, if it was initially in an eigen state of $H_i(0)$. The system therefore does not vary with time in the i-th coordinate system (stationary state). With regard to nuclear magnetic resonance, it can also be stated that the system is "spin-locked" relative to the i-th coordinate system. The expression "spin-locking" means stabilization of the deflected nuclear magnetization by long-lasting radiation from an electromagnetic field.

Fast adiabatic transfer processes with low diabatic losses can be achieved if, for each coordinate system, the rotation angle $\theta_j$ for j=0, 1, ..., i−1 of the Hamilton operator $H_j$ rises monotonally from 0 to a maximum value of $\theta_{j\,max}$ over time. The index j in this case indicates the integer sequential number of the respective coordinate system.

In this case, the movement with time (change in direction) of the Hamilton operator H(t) in one coordinate system is described by transformation to the subsequent coordinate system. The self-commutation condition must then be satisfied for the last (i-th) coordinate system that was considered. In this case, the system is stationary in the i-th coordinate system (spin-lock) if it was initially already in an eigen state for $H_i(0)$ and the system dynamic response is determined exclusively and uniquely by the interleaved coordinate system transformations.

If the system is not initially in an eigen state of $H_i(0)$, then it carries out a simple precession about $H_i(t)$. The dynamic response of the system is thus defined uniquely by the superimposition of the precession movement and the interleaved coordinate system transformations.

Particularly in the situation where the differential equation system that is produced is underdefined, the differential equation system can be solved by means of at least one secondary condition for the physical system under consideration. Secondary conditions such as these are sufficiently well known, and are already used for determining pulse shapes on the basis of the conventional adiabatic condition. One secondary condition may, for example, be a defined movement of the tip of the Hamilton operator H(t) in a defined coordinate system, with the movement being, for example, circular, elliptical or rectangular.

The secondary conditions may, for example, be holonomic, that is to say they may be in the form of equations in the sought variables for the system and time. However, they need not necessarily be holonomic and, in the same way as the self-commutation condition, may be represented by a differential equation system.

The nature of the coordinates that are used may be chosen as a function of the secondary conditions for the system under consideration. For example, polar coordinates, elliptical coordinates or Cartesian coordinates may thus be used.

The differential equation system which is produced may be solved as an initial value problem or as a-boundary value problem, in order to calculate the parameters. When the Hamilton operator $H_{i-1}(t)$ is transformed from the instantaneous coordinate system, the (i−1)-th coordinate system, to the subsequent coordinate system, the i-th coordinate system, a fixed offset angle $\theta_i$ occurs. The Hamilton operatora $H_{i-1}(t)$ is aligned relative to a defined Z axis of the (i−1)-th coordinate system. The Z axis of the subsequent, i-th coordinate system, is assumed to be in the same direction as the vector $a_{i-1}$ after rotation through the angle $\theta_{i-1}$. The rotation takes place in the plane which is defined by the Z and X or Y axis of the (i−1)-th coordinate system, so that the remaining Y or X axis is identical for the (i−1)-th and i-th coordinate systems. The vector of the angular velocity $\dot{\theta}_{i-1}$ points in this direction. The direction of the resultant Hamilton operator $H_i(t) = a_{i-1}(t) 1_z + \dot{\theta}_{i-1}(t) 1_{x,y}$ is thus obtained from the components $a_{i-1}(t)$ in the Z direction and $\dot{\theta}_{i-1}(t)$ in the Y or X direction. The resultant Hamilton operator H(t) points into the space of the i-th coordinate system and is offset through the angle $\theta_i$ relative to the vector $a_{i-1}(t)$ along the Z axis of the i-th coordinate system.

System conditions are feasible in which it is advantageous to carry out a transformation of the coordinate system through the offset angle $\theta_i$, which results from the transformation, between the defined Z axis of the i-th coordinate system and the Hamilton operator $H_i(t)$ in this coordinate system, in order to eliminate the influence of the offset angle $\theta_i$.

The method can advantageously also be used for calculation of the parameters of the Zeeman frequency or the parameters of a linear field gradient which is connected in order to determine the Zeeman frequency.

The method can also be used for calculation of the parameters for frequency-modulated and/or amplitude-modulated electromagnetic pulses from two or more input radiation sources.

The method can also be used for calculation of the parameters for mechanical rotation of a sample under consideration, such as the orientation of the rotation and the rotation velocity.

BRIEF DESCRIPTION OF THE DRAWINGS

The invention will be explained in more detail in the following text with reference to the attached drawings, in which.

DETAILED DESCRIPTION OF A PREFERRED EMBODIMENT OF THE INVENTION

In order to understand the method according to the invention, the quantum-mechanical system in which the adiabatic transfer processes are carried out will be explained first of all.

An electrical circulating current I produces a magnetic dipole field with a magnetic dipole moment $\mu = I \times A$, where A is defined as a vector at right angles to the surface covered by the circulating current I. In an homogeneous magnetic field with the magnetic inductance B, the magnetic dipole experiences a torque $M = \mu \times B$ which is zero when the dipole moment $\mu$ is aligned parallel to the magnetic induction B, that is to say when the circulating current I is flowing at right angles to the magnetic induction B. Energy has to be consumed in order to rotate the dipole moment through an angle $\alpha$ with respect to the magnetic induction B. In this case, in accordance with the laws of quantum mechanics, it must be remembered that only discrete energy states (orientations) are possible.

With regard to orbital magnetism, the revolving charged particles (electron, proton, neutron) are regarded as a circulating electric current I.

On the basis of quantum mechanics, the orbital angular momentum can assume only discrete values. This also applies to the intrinsic angular momentum or particle spin. The orbit angular momentum quantum number of a particle occurs only as an integer. In contrast, the spin quantum number may assume half-integer values. Electrons, protons and neutrons are spin half particles. In consequence, only two spin settings are possible with respect to the Z direction, with the Z axis being defined as the axis about which the intrinsic rotation takes place. The intrinsic angular memontum thus precesses about the Z axis. The angular momentum is linked to a magnetic dipole moment $\mu$, which likewise precesses about this Z axis and is quantized.

If the magnetic dipole moment is located in a magnetic field with a magnetic induction $B_z$, then this defines a preferred direction. Relative to the magnetic induction $B_z$, the magnetic dipole moment can be set only to specific values, since only discrete energy states (orientations) are possible.

If a magnetic alternating field at a resonant frequency is now injected at right angles to the induced magnetic field, then a transition between the energy levels of the elementary particles and reversal of the magnetic moment takes place. Depending on the field strength $B_z$, microwaves in the Gigahertz band are used for this purpose for electron spin resonance, and radio waves in the band between 60 MHz and 1 GHz are used at the moment for nuclear spin resonance. The critical factor for the respective experiment is not only the frequency but also the pulse shape and, when two or more radiation sources are used, the relative phase of the pulses is also important.

Figure 1:
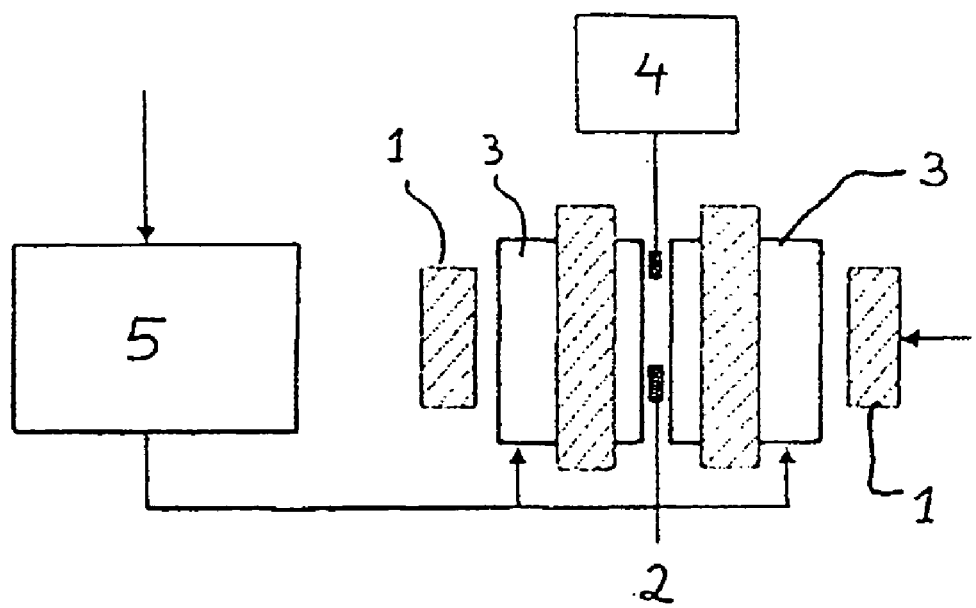
FIG. 1 shows an outline sketch of a resonance spectrometer for adiabatic transfer processes.

FIG. 1 shows the basic configuration of a resonance spectrometer. The magnet arrangement 1 is used to apply a homogeneous and constant magnetic field $B_z$, this defining a preferred direction. A sample 2 is introduced into the magnetic field. Frequency-modulated and/or amplitude-modulated electromagnetic pulses are introduced by means of radio-frequency coils 3 at right angles to the magnetic field $B_z$ in order to excite the sample 2, and a transition is forced to occur between the energy levels of the elementary particles under consideration. The resonant signals are registered in an evaluation unit 4, and are reconstructed, if required, by means of a Fourier transformation.

The application of a spatially-dependent resonance frequency (linear field gradient produced by means of gradient coils) allows a spatially-dependent measurement to be carried out by frequency or phase encoding. This is used in particular for medical magnetic resonance imaging.

The applied pulses are produced in a pulse generator 5, and are of such a design that diabatic losses are avoided as much as possible. The transfer processes should thus take place adiabatically. The adiabatic hypothesis in quantum theory states that a system which is initially in a specific stationary quantum-mechanical state remains in this state provided that the change of the parameters of the system, such as the external field strengths, takes place sufficiently slowly. The adiabatic hypothesis thus results in a statement about the time dependency of the Hamilton operator H(t) for the limit situation of long times. In order to avoid diabatic losses, it is thus desirable for the change in the direction (rotation) of the Hamilton operator H(t) through the angle θ to take place as slowly as possible. This means that the angular velocity $\dot{\theta}$ tends to zero. However, in practice, this is not feasible since, on the one hand, the experiments are intended to be carried out within a finite time. On the other hand, relaxation processes occur, so that the system reverts to the original equilibrium state. The adiabatic transfer process must therefore be carried out more quickly than the relaxation time.

The method will be explained in more detail with reference to a two-level system. In this case, the Hamilton operator is $$H_0(t) = \Delta_0(t)I_z + \omega_0(t)I_x$$

where $I_z$, $I_x$ and $I_y$ are the Cartesian coordinates components of the spin ½ angular momentum.

$H_0(t)$ is in a rotating coordinate system, which rotates at the instantaneous carrier frequency of the input radiation around the direction of the applied external constant Zeeman field, in which the Z axis of the coordinate system is also located.

The resonance offset $\Delta_0(t)$ defines the internal energy of the system, and the field amplitude $\omega_0(t)$ defines the coupling of the two-level system to the radiation field. The fixed initial phase of the radiation is arbitrarily set to zero. When a linear-polarized field is used, $H_0(t)$ already takes account of what is referred to as the "rotating wave approximation" (F. Bloch and A. J. Siegert, Physical Review 57, 522, 1940).

Figure 2:
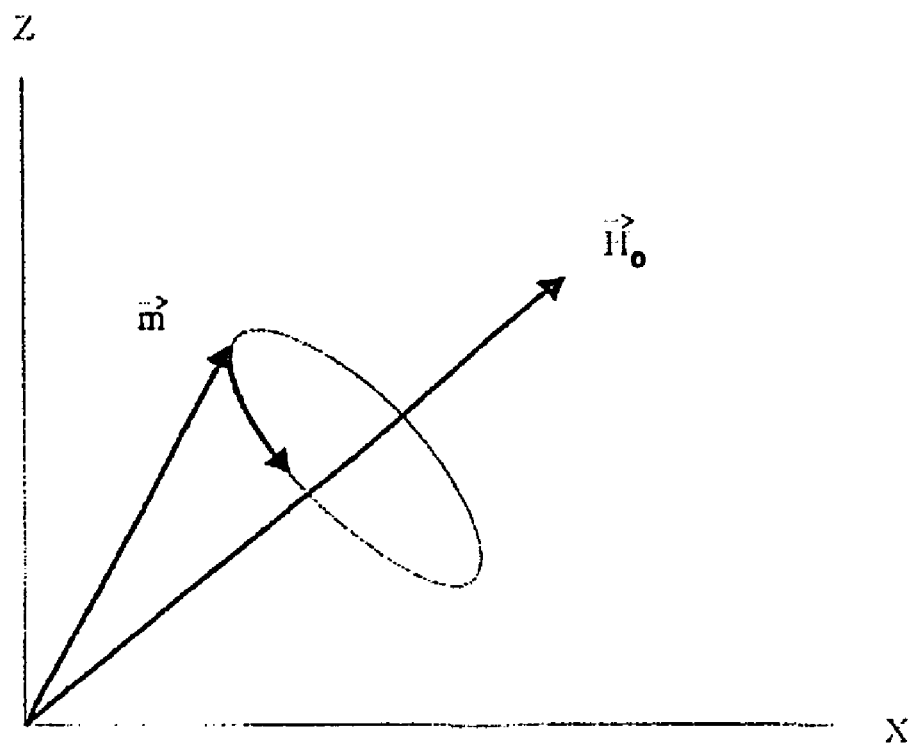
FIG. 2 shows a vector diagram of a magnetic moment $\vec{m}$ rotating about the Hamilton operator H.
Figure 3:
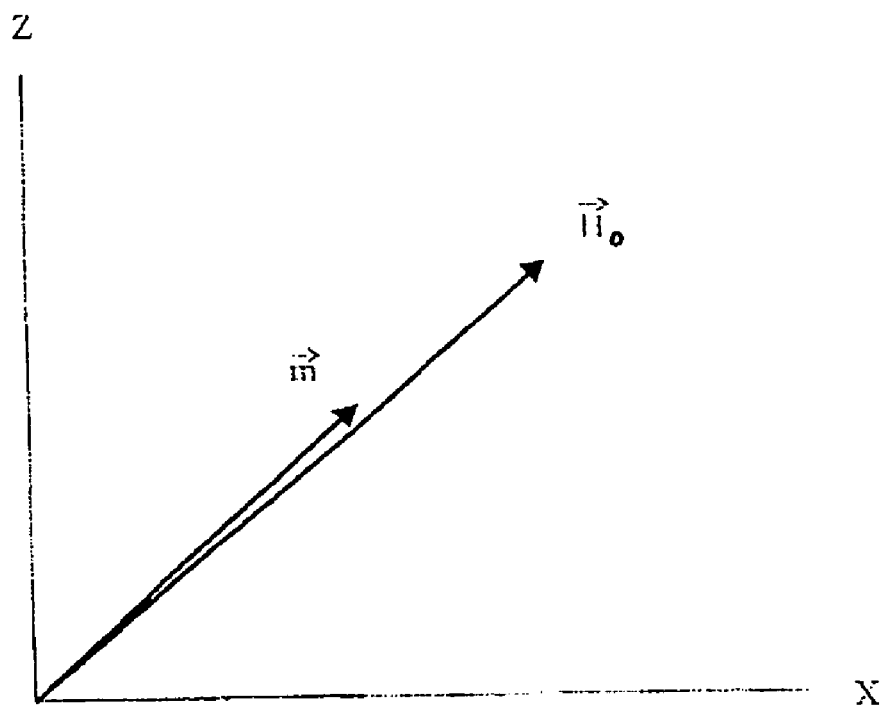
FIG. 3 shows a vector diagram of a rotating magnetic moment $\vec{m}$ which is closely linked to the Hamilton operator $\hat{H}$.

As can be seen clearly from FIG. 2, the vector of the magnetic moment $\vec{m}$ rotates about the axis of the Hamilton operator $H_0(t)$, thus describing a cone for the situation where $H_0(t)$ has a fixed direction. It is of interest for the angle between the magnetic moment $\overline{m}$ and the Hamilton operator $H_0(t)$ to be as small as possible, that is to say for the vector of the magnetic moment $\vec{m}$ to be closely linked to the Hamilton operator $H_0(t)$. This is referred to as "spin locking", and this state is sketched in FIG. 3. The Hamilton operator can also be defined as $$H_0(t) = a_0(t)\{\cos\theta_0(t)I_z + \sin\theta_0(t)I_x\}$$

The variable $a_0(t)$ is in this case the length or amplitude of the Hamilton operator $H_0(t)$, and is defined as $$a_0(t) = \sqrt{\Delta_0(t)^2 + \omega_0(t)^2}.$$

The rotation angle $\theta_0(t)$ is the tilt angle of the Hamilton operator relative to the Z axis of the rotating coordinate system, and is defined as:

$$\theta_0(t) = \arctan\frac{\omega_0(t)}{\Delta_0(t)}.$$

Figure 4:
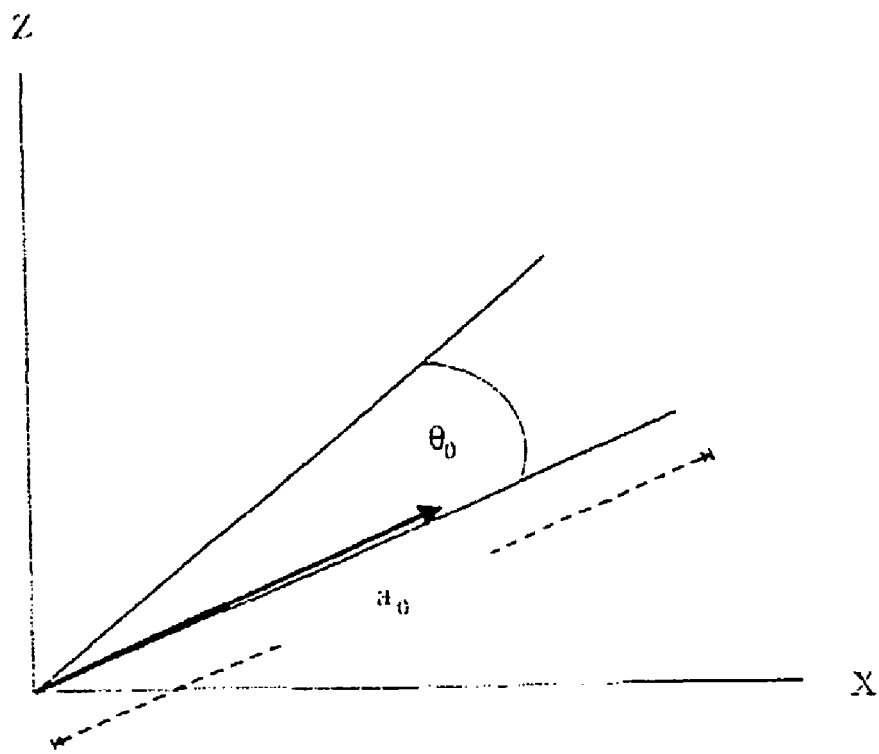
FIG. 4 shows a vector diagram of the Hamilton operator moved through the angle $\theta_0$.
Figure 5:
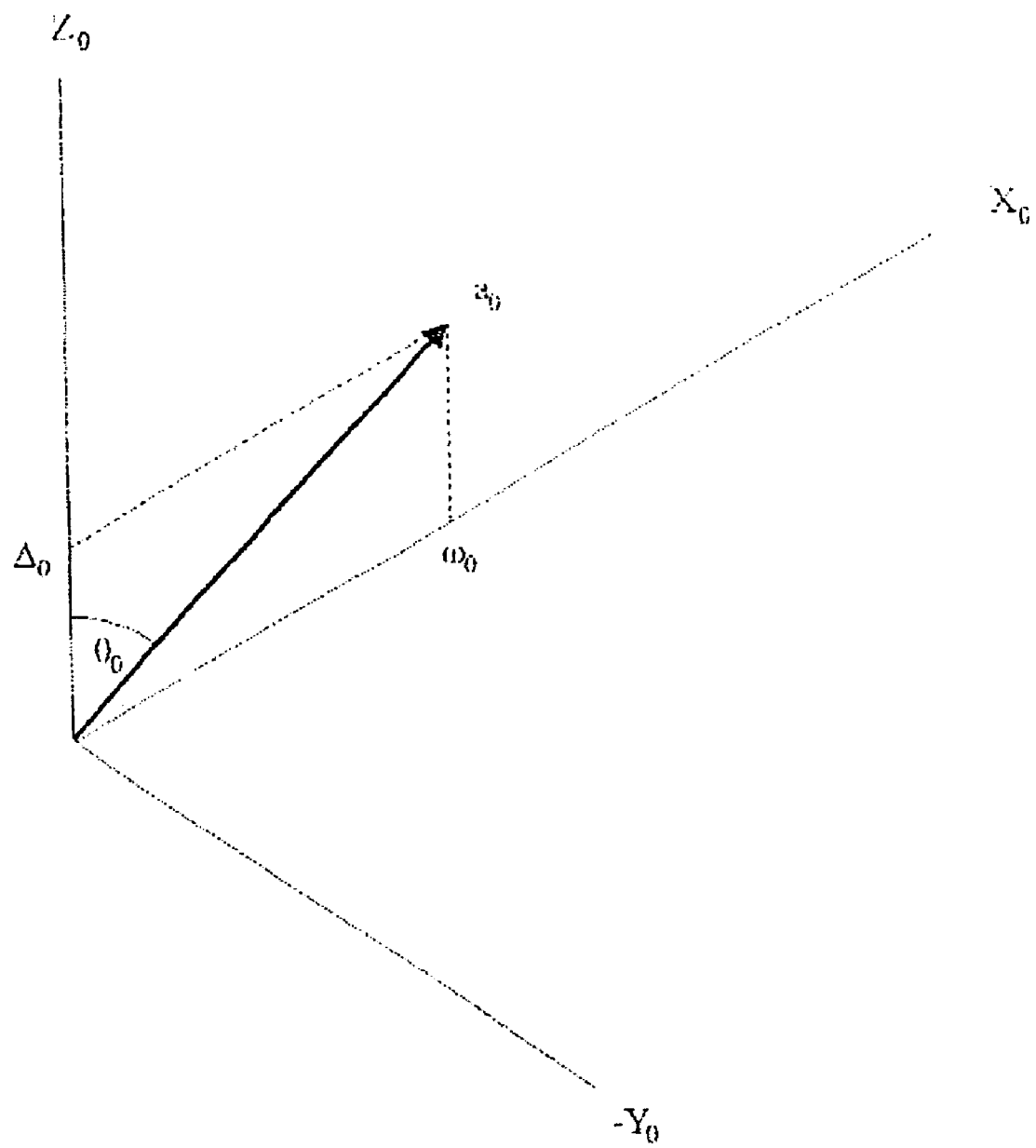
FIG. 5 shows a diagram of the Hamilton operator in the zero-th coordinate system.

For an adiabatic transfer process, it is desirable for the magnetic moment $\vec{m}$ to follow the Hamilton operator $H_0(t)$ when the angle $\theta_0$ of the latter changes. This is sketched in FIG. 4. FIG. 5 shows the Hamilton operator $H_0(t)$ with the amplitude $a_0$ in the rotating coordinate system. The amplitude $a_0$ is in this case determined from the resonance offset $\Delta_0$ and the field amplitude $\omega_0$. Variation of these two parameters with time results in a change in the length and direction ($a_0(t)$ and $\theta_0(t)$) of $H_0(t)$. The latter can be described by a transformation to a first coordinate system, whose Z axis always lies along $H_0(t)$. The first coordinate system and the rotating coordinate system have a common Y axis. The Hamilton operator in the first coordinate system is:

$$H_j(t) = a_0(t)I_z - \dot{\theta}_0(t)I_y$$

where $$\dot{\theta}_0(t) = \frac{d\theta_0(t)}{dt}.$$

The term $\dot{\theta}_0(t)I_y$, which is referred to as the "fictitious field" is the torque producing the change in the direction of $H_0(t)$ in the (original) rotating coordinate systems.

The dynamic response of the two-level system satisfies the adiabatic approximation and is also referred to as adiabatic when the term $\dot{\theta}_0(t)I_y$ is negligible in comparison to the term $a_0(t) I_z$ in $H_1(t)$.

The parameters for frequency-modulated and amplitude-modulated electromagnetic pulses, by means of which the adiabatic approximation is intended to be satisfied, are conventionally calculated in a corresponding manner from the adiabatic condition or inequality:

$$\dot{\theta}_0(t) \ll a_0(t) = \sqrt{\Delta(t)^2 + \omega_1(t)^2}$$

where the quotient $$Q(t) = \left| \frac{\overset{*}{\theta}_0(t)}{a_0(t)} \right| << 1$$

is the adiabaticity factor Q(t), a measure of the quality of the pulse to be used (in the literature, $$\frac{1}{Q(t)}$$

is also referred to as the adiabaticity factor).

The invention is based on the finding that the sought modulation functions have to keep the system in an eigen state (closely linked to the Hamilton operator) even though the Hamilton operator changes its direction in the rotating coordinate system. This can be achieved if the Hamilton operator $H_1(t)$ never acts as a perturbation (adiabatic transfer process) in the first coordinate system, that is to say when the self-commutation condition of the Hamilton operator $$[H_1(t),H_1(t')]=H_1(t)H_1(t')-H_1(t')H_1(t)=0, \text{ for } \forall t,t'>0$$

is satisfied. This is equivalent to the condition:

$$\dot{\theta}_0(t)=\tan(\theta_1)a_0(t), \text{ where } \theta_1=\text{constant}$$

where $\theta_1$ is the angle of the Hamilton operator relative to the Z axis of the first coordinate system.

The method for calculation of the parameters of the frequency-modulated and amplitude-modulated electromagnetic pulses is thus based on the exact adiabatic condition.

$$\frac{\overset{*}{\theta}_0(t)}{a_0(t)} = \tan\theta_1 = \text{constant.}$$

In contrast to the conventional method, the parameters are thus calculated on the basis of the analysis of the complete physical system rather than on the basis of boundary conditions which are defined in a fuzzy manner by the adiabatic inequality.

The dynamic response of the system is taken into account by transformation of the Hamilton operator from an instantaneous coordinate system to a subsequent coordinate system. This results in a description of the time dependency of the direction change of the Hamilton operator H(t).

FIGS. 5 to 8 show the transformation of the coordinate systems as a function of the rotation angles θ, where the indices i=1, 1, 2 and 3 indicate the respective integer sequential numbering of the coordinate system. In the description, the index i is always used as a variable for the number of the relevant coordinate system. The already described rotating coordinate system, which is the starting point for the analysis, is thus the zero-th coordinate system.

The Hamilton operator is described in the rotating, or zero-th coordinate system as:

$$H_0(t)=\Delta(t)I_z+\omega_0(t)I_x.$$

Figure 6:
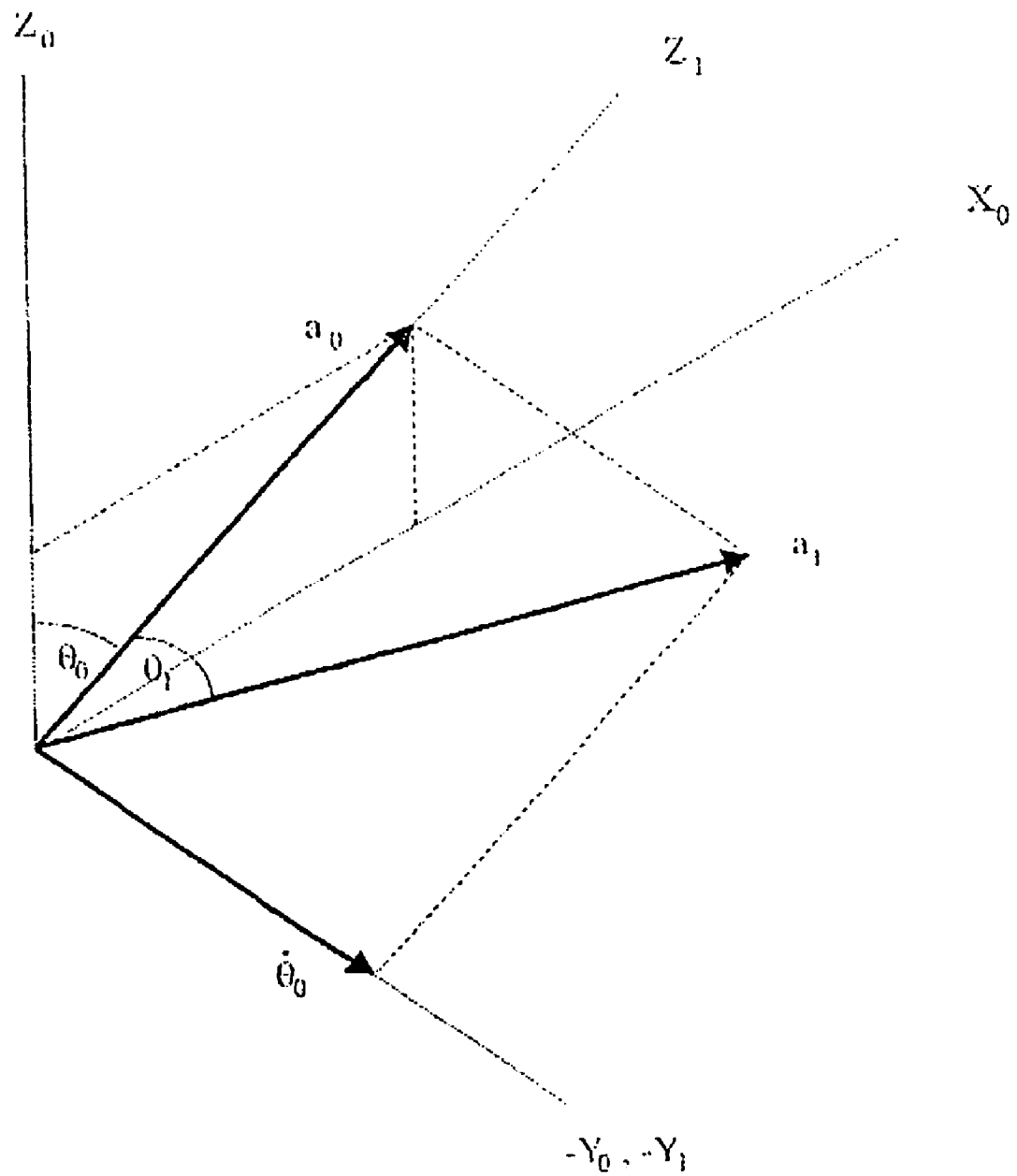
FIG. 6 shows a diagram of the transformed Hamilton operator in the 1st coordinate system.
Figure 7:
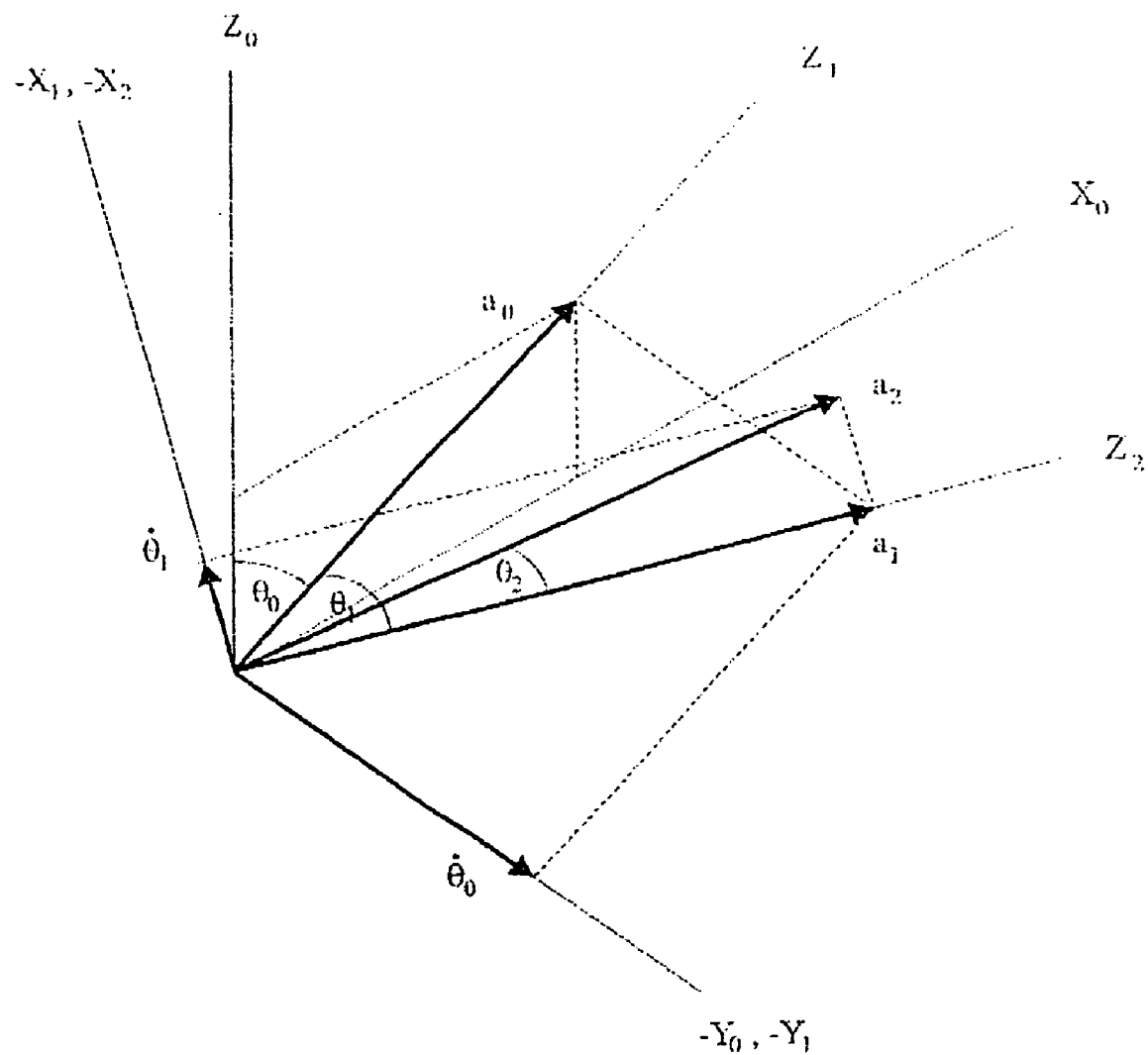
FIG. 7 shows a diagram of the transformed Hamilton operator in the 2nd coordinate system.
Figure 8:
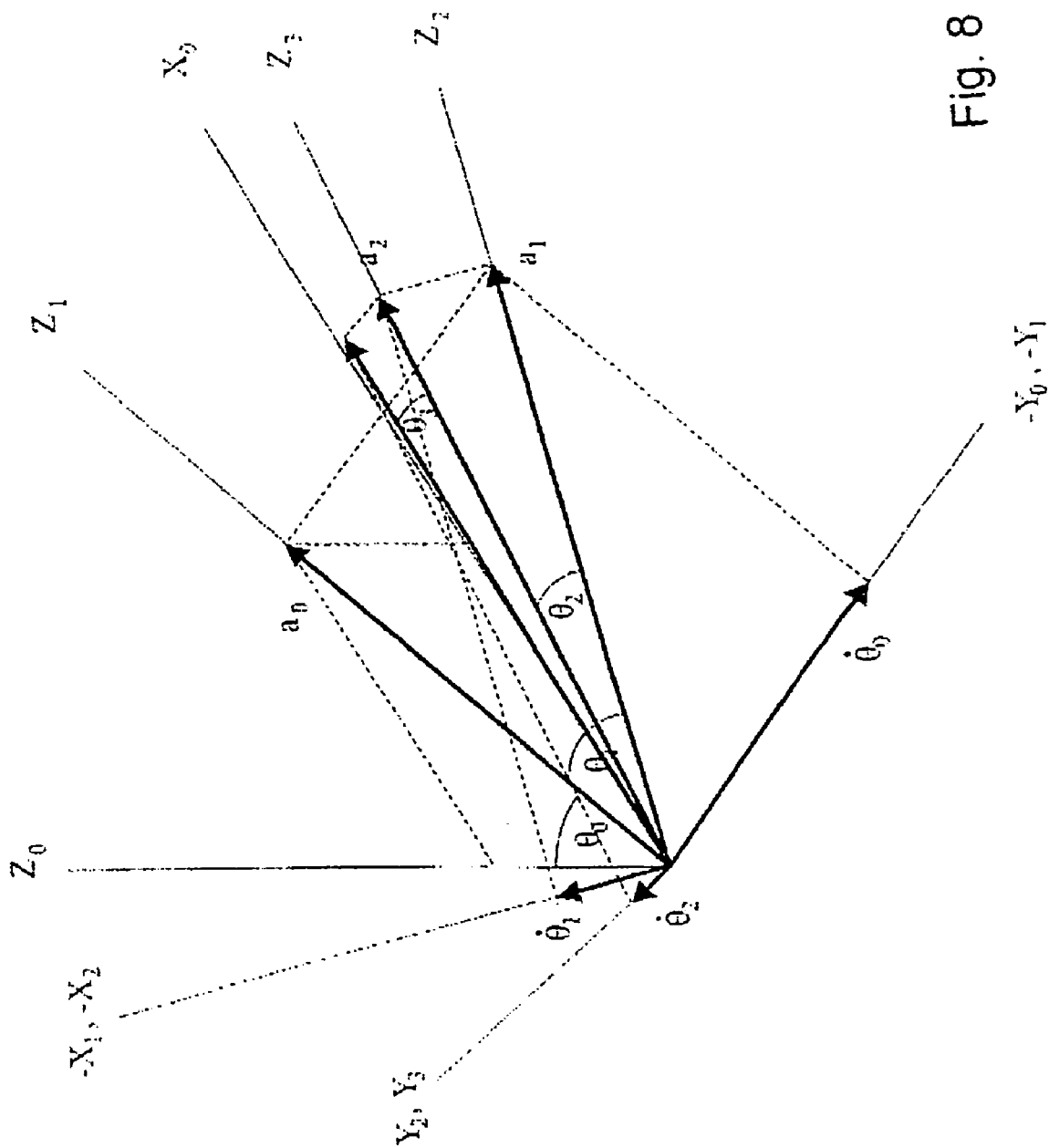
FIG. 8 shows a diagram of the transformed Hamilton operator in the 3rd coordinate system.

The rotation through the angle $\theta_0$ may be described as a rotation of the coordinate system or as a transformation of the Hamilton operator from the zero-th coordinate system to the subsequent coordinate system, as is sketched in FIG. 6. The new Z axis of the subsequent first coordinate system in this case extends in the same direction as the amplitude $a_0$. The transformed Hamilton operator $H_1(t)$ can then be represented by the equation $$H_1(t)=a_0(t)I_z-\dot{\theta}_0(t)I_y.$$

The angular velocity $\dot{\theta}_0$ is a vector along the Y axis, since the rotation takes place in the Z-X plane of the original coordinate system. This results in an offset angle $\theta_1$ for the resultant Hamilton operator $H_1(t)$ relative to the Z axis $Z_1$ of the first coordinate system.

It is now necessary for the Hamilton operator $H_1(t)$ to be self-commutating at all times in the first coordinate system, that is to say to satisfy the equation $$[H_1(t),H_1(t')]=0, \text{ for } \forall t,t' \geq 0$$

or an equivalent to this.

$$\dot{\theta}_0(t)=\tan(\theta_0)a_0(t), \text{ where } \theta_1=\text{constant}.$$

This is a differential equation in the sought modulation functions, so that the solution in the parameters $\Delta_1(t)$ and $\omega_1(t)$ for a frequency-modulated and amplitude-modulated electromagnetic pulse results, by means of which the transfer process is adiabatic. The solution functions have the index 1, since they are determined from the commutator condition in the first coordinate system. For small rotation angles $\theta_1$, the angular velocity, that is to say the derivative, tends to zero, so that the modification of the quantum status for finite field amplitudes takes a relatively long time. The reorientation takes place more quickly for larger rotation angles $\theta_1$, and this leads to shorter pulse lengths. However, the angle of the precession cone is disadvantageously increased, so that the magnetic moment vector $\vec{m}$ is no longer optimally closely linked to the Hamilton operator H. This is the situation when the initial state of the system, or the magnetization $\vec{m}$ for the time t=0, lies along $H_0(0)$ in the zero-th coordinate system, as is the case for most experiments.

The state is thus never close to the eigen state of the Hamilton operator $H_1(t)$ in the first coordinate system, so that the adiabatic dynamic response is hampered, and large diabatic losses are expected.

However, it is possible to achieve fast adiabatic transfer processes with low losses, provided that the angle $\theta_1(t)$ is variable, and is not constant. In this case, an adiabatic increase in the rotation angle $\theta_1(t)$ from zero to a maximum value of $\theta_{1\ max}$ is assumed, so that the rotation angle $\theta_1$ rises monotonally from $\theta_1(0)=0$ initially to a final value of $\theta_1(\tau)=\theta_{1max}>0$, while the effective field in the zero-th coordinate system moves from the Z axis to the X axis, as described above with reference to FIG. 5, in the time τ (pulse length). Since the speed of the modulations is limited in practice, the rotation angle must be $$\theta_{1max}(\tau) < \frac{\pi}{2}.$$

The effective field in the first coordinate system is now likewise aligned exactly along the magnetization at the start of the pulse. If a time-dependent Hamilton function can be defined such that the rise in the rotation angle $\theta_1(t)$ is adiabatic, large resultant rotation angles $\theta_1(\tau)$ can be achieved without significant diabatic losses. As far as this final state, the movement of the Hamilton operator and of the effective field in the first coordinate system can be described by transformation to a second coordinate system analogously to the transformation already carried out. In this case as well, the exact adiabatic condition must once again be satisfied, which is expressed by self-commutation of the Hamilton operator $H_2(t)$ in the second coordinate system. The spin-locking (self-commutation) of the Hamilton operator $H_2(t)=a_1(t)l_2-\dot{\theta}_1(t)l_x$ with suitable modulation functions $A_2(t)$ and $\omega_2(t)$ implies a fixed rotation angle $\theta_2$ between the effective field and the Z axis of the second coordinate system. The magnetization with a component $\propto I_z \cos\theta_2$ along the effective field of the second coordinate system and with an orthogonal component $\propto -I_x \sin\theta_2$ is once again not in the eigen state of the Hamilton operator $H_2(0)$ for the time t=0.

However, the modulation functions of the second coordinate system where $0 \leq 74_1(t) \leq \theta_1(\tau)$ may be better than the modulation functions of the first coordinate system where $\theta_1 = \text{constant} = \theta_1(\tau)$ for achieving an adiabatic transfer, provided that $\theta_2 < \theta_1$, since the requirements for an initial eigen state are satisfied to a greater extent, and the losses are reduced. The assumption of $\theta_2 < \theta_1$ is always satisfied, since the effective field in the first coordinate system is reorientated from $$\theta_1(0) = 0 \text{ to } \theta_1(\tau) < \frac{\pi}{2},$$

while the effective field in the rotating or zero-th coordinate system swivels from $$\theta_0(0) = 0 \text{ to } \theta_1(\tau) = \frac{\pi}{2}$$

at the same time, and thus $$\theta_1(\tau) = \int_0^\tau a_1(t)\,dt\tan\theta_2 \leq \frac{\pi}{2}$$
$$= \int_0^\tau a_0(t)\tan\theta_1(t)\,dt \leq \int_0^\tau a_0(t)\,dt\tan\theta_1(\tau).$$

Since $$a_1(t) = \{a_0(t)^2 + \overset{*}{\theta}_0(t)^2\}^{\frac{1}{2}} \geq a_0(t),$$

$\tan\theta_2 \leq \tan\theta_1(\tau)$ and thus $\theta_2 < \theta_1(\tau) = \theta_1$. Since the assumption of $$\frac{\pi}{2}$$

as a maximum value is not necessary and smaller values can likewise be assumed, what has been stated above also applies for a rotation angle $$\theta_3 = \text{constant} < \frac{\pi}{2}$$

with respect to a temporal increase $\theta \leq \theta_2(t) \leq \theta_2(\tau)$, that is to say, in the end, $\theta_3 < \theta_2(\tau) < \theta_1(\tau)$.

This clearly shows that the method with transformation to subsequent coordinate systems can be carried out iteratively. This allows n-th order modulation functions to be calculated, and the sufficiently low-loss adiabatic transfer processes are realized in the rotating coordinate system using suitable initial conditions, for example the eigen state of the Hamilton operator $H_n(0)$. The transformation from a zero-th coordinate system to a third coordinate system is sketched in FIGS. 5 to 8. The system of equations is in this case obtained for an n-th coordinate system with n=0, 1, 2 . . . as an integer, as follows:

Hamilton operator: $H_n(t)=a_{n-1}(t)l_2+\dot{\theta}_{n-1}(t)l_{x,y}$
Self-commutation: $[H_n(t),H_n(t')]=0$, for $\forall t,t' \geq 0$
Spin-locking: $\dot{\theta}_{n-1}(t)=\tan\{\theta_n\}a_{n-1}(t)$, for $\theta_n$=constant For the iteration method, the ratio of the rotation angles is assumed to be:

$$\theta_n < \theta_{ntmax} < \ldots < \theta_{1max} < \pi/2.$$

The differential equations for spin-locking represent a differential equation system with which the parameters of the optimized modulation signal can be calculated. These can be solved as an initial value or boundary value problem, depending on the system and secondary condition under consideration.

Since the amplitude of the Hamilton operator is obtained on the basis of the function in the n-th coordinate system $$a_n(t)=\sqrt{a_{n-1}(t)^2+\dot{\theta}_{n-1}(t)^2}$$

as is clearly shown geometrically in FIG. 6, the following differential equation system can be produced for an n-th order pulse in order to determine the modulations $\Delta_n(t)$ and $\omega_n(t)$ (the index n relates to the solution of the commutator in the n-th coordinate system), as parameters:

$$\dot{\theta}_0(t)=\tan\{\theta_1(t)\}a_0(t)$$

$$\dot{\theta}_1(t)=\tan\{\theta_2(t)\}a_1(t)=\tan\{\theta_2(t)\}\sqrt{1+\tan\{\theta_1(t)\}^2}a_0(t)$$

$$\dot{\theta}_2(t)=\tan\{\theta_3(t)\}\sqrt{1+\tan\{\theta_2(t)\}^2}\sqrt{1+\tan\{\theta_1(t)\}^2}a_0(t)$$

$$\downarrow$$

$$\overset{*}{\theta}_{n-1}(t)=\tan\{\theta_n(t)\}\prod_{i=n-1}^{\theta}\sqrt{1+\tan\{\theta_2(t)\}^2}\,a_0(t)$$

$$\dot{\theta}_n=0$$

These are n+1 coupled nonlinear differential equations in the variables $\theta_0(t),\theta_1(t),\theta_2(t)\ldots,\theta_{n-1}(t),\theta_n$, with the last mentioned being included in the solution as a constant, although it is trivial.

The equation system can now be solved. If it has not yet been determined sufficiently, at least one free secondary condition can be taken into account, such as:

$$a_0=a_0(t); a_0=a_0(\theta_0(t), \theta_1(t), \ldots, \theta_n, t).$$

For example, the movement of the tip of the Hamilton operator in the zero-th coordinate system, that is to say the path described by the vector $a_0$, can also be used as a secondary condition. This path is the trajectory of the Hamilton operator $a_0=a_0(\theta_0)$, that is to say the curve which is described by the Hamilton operator of the system in the zero-th coordinate system. This curve may, for example, be semicircular, elliptical or rectangular. An adiabatic dynamic response from the thermal equilibrium (magnetization along the Z axis of the O-th coordinate system) can be assumed as an initial condition, by setting $\theta_0(0)=0$. The path can in this case, for example, be described as a half ellipse on the basis of the formula $$a_0(\theta_0) = \frac{A}{\sqrt{1+a^2\sin(\theta_0)^2}}$$

for the trajectory in the defined zero-th coordinate system (A=half axis, $\epsilon$=eccentricity).

The two unknown parameters $\Delta_n(t)$ and $\omega_n(t)$ can be calculated from the determined variables $\theta_0(t)$ and $a_0(t)$ by means of the already mentioned relationships:

$$a_0(t)=(\Delta_n(t)^2+\omega_n(t)^2)^{1/2} \text{ and}$$

$$\theta_0(t) = \arctan\frac{\omega_n(t)}{\Delta_n(t)}$$

The key element for the method according to the invention is the self-commutating characteristic of the Hamilton operator in the n-th coordinate system. The self-commutation thus represents a major condition. The secondary conditions can be chosen relatively freely in a known manner, as a function of the respective system under consideration.

Instead of using the angular variables $\theta_i(t)$, the equation system can be expressed in terms of the sought function $\Delta_n(t)$ $\omega_n(t)$.

The condition $F(\Delta_n(t),\omega_n(t),t)=0$ can then be used to eliminate either $\Delta_n(t)$ or $\omega_n(t)$ and the corresponding derivatives.

Figure 9:
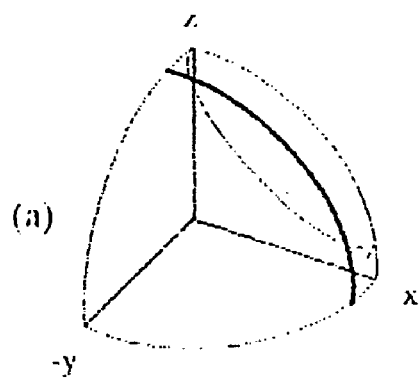
FIG. 9 shows a trajectory of the Hamilton operator and of the governing moment on one octant of the unit sphere of the zero-th coordinate system for a 1st order modulation function.
Figure 10:
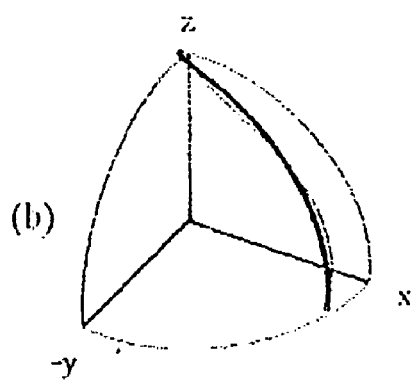
FIG. 10 shows a trajectory of the Hamilton operator and of the magnetic moment on one octant of the unit sphere of the zero-th coordinate system for a 2nd order modulation function.
Figure 11:
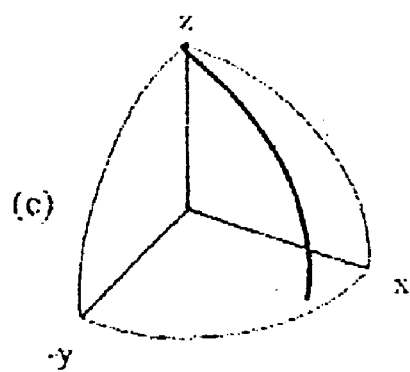
FIG. 11 shows a trajectory of the Hamilton operator and of the magnetic moment on one octant of the unit sphere of the zero-th coordinate system for a 3rd order modulation function.

The method will be described once again in the following text using FIGS. 9 to 11 and with reference to a specific exemplary embodiment. The pulse length is in this case set to $\tau=100$ μs. This means that the effective field moves in the rotating or zero-th coordinate system from the Z axis to the X axis $$\left(0 \le \theta_0(t) \le \frac{\pi}{2}\right)$$

in a time of 100 μs. In order to achieve an alignment with the Z axis at the time t=0, use is made of the secondary condition that the effective field in the rotating coordinate system moves on a quarter of an ellipse on its trajectory from the Z axis to the X axis based on the condition $$\left(\frac{\Delta_n(t)}{A}\right)^2 + \left(\frac{\omega_n(t)}{B}\right)^2 = 1,$$

where A=25 kHz and B=8 kHz are the major and minor axes of the ellipse. The axis B is the peak amplitude of the pulse applied at the time t=$\tau$. The initial state of the system is thermal equilibrium (magnetization along the Z axis of the zero-th coordinate system).

Figure 12:
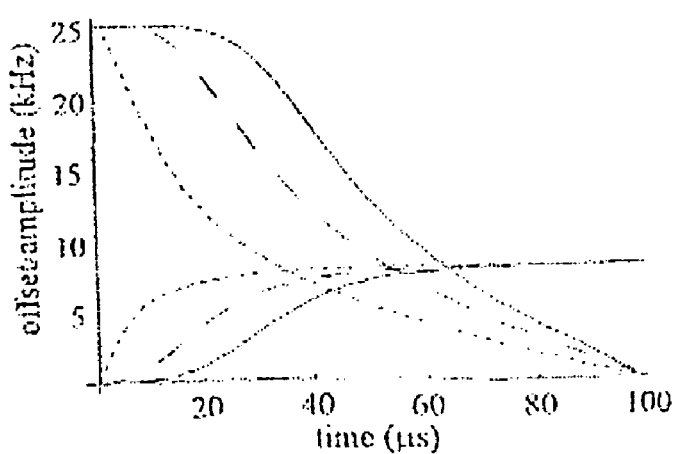
FIG. 12 shows a curve of the determined 1st-order to 3rd-order frequency-modulation and amplitude-modulation functions plotted against time.

The corresponding differential equation systems for first-, second- and third-order modulation functions are integrated numerically using a Runge-Kutta algorithm, as shown in FIG. 12. The reorientation of the corresponding Hamilton operator in time, and the trajectory of the state, are shown on the unit sphere of the rotating or zero-th coordinate system. If $\tau=100$ μs and for the chosen secondary condition, the constant rotation angle of the first-order pulse in the first coordinate system is $\theta_1=12.4°$. As is shown in FIG. 9, major discrepancies occur between the state trajectory and the path of the Hamilton operator. This indicates a nonadiabatic dynamic response. The rotation angle of the first coordinate system may vary with time in order to calculate the second-order modulation functions. For a constant rotation angle of $\theta_2=2.2°$ and a monotonic rise $0 \le \theta_1(t) \le \theta_1(\tau)=20°$, the reorientation of the effective field in the first coordinate system is achieved with simultaneous rotation through $\pi/2$ of the effective field in the zero-th coordinate system in $\tau=100$ μs. A significant improvement in the adiabatic transfer process can be observed if modulations are derived in the second coordinate system, since the state trajectory is virtually identical to the path of the Hamilton operator, as can be seen from FIG. 11. Modulated third-order pulses were calculated for a constant rotation angle of $\theta_3=0.5°$, where $0 \le \theta_2(t) \le \theta_2(\tau)=5.2$, $0 \le \theta_1(t) \le \theta_1(\tau)=26.6°$ and $0 \le \theta_0(t) \le \theta_0(\tau)=90°$ for $\tau=100$ μs. Thus even modulation functions calculated after even three iteration steps lead to optimum adiabatic transfer processes, which are sufficiently fast ($\tau=100$ μs).

FIG. 12 shows the modulation functions produced in the examples mentioned above, with the curves which fall from the 25 kHz value representing the resonance offset, that is to say the actual frequency modulation function, and the curves which rise from 0 kHz representing the amplitude modulation, plotted against the time.

The finely dashed curves represent a first-order modulation function. The steep rise in the resonance offset function can be interpreted as a large opening angle for the rotating magnetic moment vector.

The long dashed curves are second-order modulation functions. Optimum results can be achieved just with a third-order modulation function, as is sketched by a solid line.

This theoretically described method can be used to determine pulse shapes in two-level or multiple level systems, and is dependent on a coherent radiation source with a variable amplitude and carrier frequency, such as radiofrequency waves or lasers. This opens up a large number of applications in magnetic resonance and coherent optics. The method can thus preferably be used in medicine and in the optical industry.

A secondary condition for each application can be introduced into the method, so that the specific pulse shapes ensure improved or even optimum implementation. It is possible in this case to use, in particular, criteria which have already been found to be beneficial in the past, and which are published in different forms.

One field of application of the invention is magnetic resonance imaging. This is based on what is referred to as "slice selection", that is to say the inversion of the population in two-level systems for a given band of transition frequencies (broadband inversion). This is the classical application of adiabatic techniques. For magnetic resonance imaging, it is particularly important to produce an inversion profile with a sharp transition from the inverted area to the non-inverted area. The literature describes various criteria for this purpose, and these are incorporated as secondary conditions into the method. For example, D. Rosenfeld and Y. Zur, Magnetic Resonance in Medicine 36,124 (1996) disclose that the effective field should pass over a rectangular path with rounded corners. In. contrast to this, the text above has discussed the situation for an elliptical path relating to this.

The method according to the invention allows better-quality slice selection and the extension of the imaging process to faster relaxing tissue.

Boundary conditions other than the profile sharpness may, however, also be governing factors for the slice selection. For example, pulse shapes for optimized inversions of populations over a given frequency band and with a minimal radiation load (heating) of the sample or with presetting of a maximum permissible amplitude of the input radiation field can be determined in a similar manner using the method.

In addition to the inversion of the population, adiabatic broadband excitation of magnetization is an important technique for magnetic resonance imaging. In this case as well, the systematic method provides pulse shapes for optimized implementation with changing boundary conditions.

A further field of application for the method according to the invention is invivo spectroscopy. This makes use of adiabatic techniques in order to achieve the inversion of the population or the excitation of magnetization in a two-level system in the presence of inhomogeneities in the amplitude of the input radiation field, that is to say spatial dependency in the amplitude over the sample volume, since notoriously inhomogeneous surface coils are used. In this case as well, the systematic method makes it possible to determine pulse shapes for optimized inversion and excitation under various secondary conditions, such as minimum sample heating or fast execution (the field amplitude effectively replaces the transition frequency as a broadband parameter for use in magnetic resonance imaging). In particular, the modulation functions which are determined by the method according to the invention can be incorporated in the scheme of what are referred to as plane rotation pulses. This leads to exponentiation of the insensitivity to inhomogeneities in the amplitude of the input radiation field, and these are used as standard when using surface coils. This is described in M. Garwood and K. Ugurbil in NMR, Basic Principles and Progress (Editors: P. Diehl, E. Fluck, H. Gunther, R. Kosfeld, J. Seelig and M. Rudin) Vol. 26, Springer-Verlag, Heidelberg (1992), page 109.

The problem of field inhomogeneity and the corresponding use of adiabatic techniques also occurs to a lesser extent in magnetic resonance imaging.

A further field of application for the method according to the invention is nuclear magnetic resonance spectroscopy. There are a large number of experiments which demand broadband inversion of populations, so that the use of adiabatic techniques is worthwhile. However, until now, adiabatic inversion has required considerably longer (10 to 100 times longer) than conventional pulse techniques (non-selective pulses), which has precluded its use for systems with fast relaxation, for example in experiments on biological molecules. In this case in particular, the systematic method can overcome this by fast adiabatic transfers.

In addition to the situations described with reference to magnetic resonance imaging, situations often arise in spectroscopy in which inversion must be produced uniformly in as short a time as possible over as wide a range of transition frequencies as possible, without this being associated with any boundary conditions, such as the profile sharpness or minimal heating of the sample. What is referred to as offset-independent adiabaticity can be used in this case as a secondary condition to determine optimized pulse shapes by means of the method according to the invention, this being a criterion for particularly broadband inversion with a relatively low radiation load. The secondary condition is disclosed in A. Tannus and M. Garwood, Journal of Magnetic Resonance A 120, 133 1996.

The polarization transfer of sensitive nuclei to less sensitive nuclei (from $^1$H to $^{13}$C or $^{15}$N) is a basic technique for solid state resonance. S. Heediger, B. H. Meier, N. D. Kurur, G. Bodenhausen and R. R. Ernst, Chemical Physics Letters, 223, 283 (1994) describe the fact that this polarization transfer formally corresponds to an inversion of the population in the two-level system and can successfully be carried out adiabatically. Optimization of an adiabatic polarization transfer with the aid of the method according to the invention can improve both the signal-to-noise ratio in a large number of solid state resonance experiments and can also, for the first time, allow polarization transfer in systems with fast relaxation. The coherence transfer from magnetization to what is referred to as a quadrupolar order in solids which are doped with deuterium can also be described as being formally equivalent to excitation of magnetization in the two-level system, and can be carried out adiabatically. This is described in C. E. Hughes, R. Kemp-Harper and S. Wimperis, Journal of Chemical Physics, 108, 879 (1998). Quadrupolar order relaxation decomposition is an important indicator of macromolecular dynamics, so that an optimized adiabatic coherence transfer with pulse-shapes according to the method is useful for a large number of experiments relating to material and biophysical questions. The method according to the invention allows the determination of pulse shapes for optimized polarization and coherence transfer processes in static and, in particular, rotating solids ("Magic Angle Spinning") with inherently time-dependent interactions.

Carrying out two inversions directly one after the other once again results in the original population in the two-level system. Such "identity manipulations" form the basis of complex spectroscopic techniques for spin decoupling and for what is referred to as isotropic mixing, a specific type of coherence transfer. Spin decoupling is an integral component of many experiments in the field of nuclear magnetic resonance on liquids, solids and in-vivo, since spectral simplification and a higher signal-to-noise ratio as well as better resolution are obtained. It is very important, particularly in the case of in-vivo applications, to provide decoupling with a field amplitude which is as low as possible, in order to minimize sample heating and to cover a wide spectral bandwidth with inversion that is as fast as possible, in order to suppress artifacts ("Decoupling Side Bands"). A pulse sequence for isotropic mixing is subject to the same requirements, and these are used to assign resonance lines in complex spectra (biological molecules). The method according to the invention is suitable for determining pulse shapes for carrying out these techniques adiabatically, and these are described, inter alia, in Z. Starcuk, K. Bartusck, Journal of Magnetic Resonance A107, 24 (1994) and E. Kupce, R. Schmidt, R. Rance and G. Wagner, Journal of Magnetic Resonance 135, 361 (1998).

A further field of application for the method according to the invention is optics. Using a laser as a light source allows coherent spectroscopy in the optical wavelength band. For some time now, it has been possible to modulate the frequency and the amplitude of laser light in the continuous mode and in the pulsed mode virtually as required, which has opened up the possibility to use adiabatic techniques in a versatile manner in the field of coherent optics. In this context, reference should be made to W. S. Warren, H. Rabitz and M. Daleh, Signs 259, 1581 (1993). Adiabatic polarization and coherence transfers based on magnetic resonance, such as broadband inversion and excitation, are possible. Stimulated Raman Adiabatic Passage (STIRAP) is mentioned as one specific application of the method according to the invention, this being a technique for adiabatic coherence transfer in a three-level system, and this is described by K. Bergmann, H. Theuer and B. W. Shore, Review of Modern Physics 70, 1003 (1998). The STIRAP technique allows population reversal between two long-lived energy levels, whose electrical dipole transition is forbidden, including a third short-lived stimulated state, without excessive losses due to spontaneous emission. The losses that still occur due to spontaneous emission are caused by imperfections in the adiabatic transfer process, and thus correspond to the diabatic losses. In the STIRAP method, two lasers (pump and Stokes lasers) are used to produce radiation successively, but in the opposite sense to the intuitive sequence. The radiation is first of all produced by the Stokes laser, and then by the pump laser. This method is described in J. Orek, F. P. Hioe and J. H. Eberly, Physical Review A 29, 690 (1984). This complex transfer in a three-level system is equivalent to adiabatic stimulation in a two-level system, so that pulse shapes for the two lasers can be calculated using the method according to the invention. An optimized STIRAP process leads to improvements in the various applications of the STIRAP method, for example for spectroscopy for chemical reaction kinetics. In this context, reference should be made to U. Gaubatz, P. Rudekki, S. Schiemann and K. Bergmann, Journal of Chemical Physics 92, 5363 (1990). The implementation of the STIRAP method without diabatic losses is of particular interest, in which case the pulse shapes which are required for this purpose can be determined using the method according to the invention. This could be a fundamental step in the production of a quantum computer for the first time.

The problems relating to quantum computers are described, for example, in M. B. Plenio and P. L. Knight, Physical Review A 53, 2986 (1996).

The invention claimed is:

1. A method for the generation of frequency-modulated and/or amplitude-modulated electromagnetic pulses for inducing adiabatic transfer processes in a quantum-mechanical system, with the dynamic processes in the quantum-mechanical system being described by a Hamilton operator (H(t)) in an instantaneous coordinate system, characterized by
   a) transformation of the Hamilton operator from an instantaneous coordinate system to a subsequent coordinate system in order to describe the time dependency of the direction change of the Hamilton operator;
   b) determination of the self-commutation of the Hamilton operator in the subsequent coordinate system, said self-commutation being commutation of the Hamilton operator in the subsequent coordinate system at any time t with the Hamilton operator in the subsequent coordinate system at any different time t', with a differential equation system being produced;
   c) calculation of the parameters from the differential equation system which is produced, said parameters optimizing said generation of pulses for adiabatic transfer processes in a ciuantum-mechanical system.

2. The method as claimed in claim 1, characterized by step a) being carried out iteratively, with the transformation from the instantaneous coordinate system to a subsequent coordinate system through the rotation angle($\theta$) which describes the direction change of the Hamilton operator (H(t)).

3. The method as claimed in claim 1, characterized by the self-commutation being determined by calculation of the operator equation:

$$H(t) \cdot H(t') \cdot H(t') \cdot H(t) = 0$$

where H(t) is the Hamilton operator in the subsequent coordinate system, t is any time and t' is any time which is not the same as t, where t and t' are greater than 0.

4. The method as claimed in claim 1, characterized by the self-commutation being determined by assuming a constant ratio between the rotation angle rate ($\dot\theta(t)$) and the magnitude (a(t)) of the vector component of the Hamilton operator (H(t)) on a defined Z axis of the instantaneous coordinate system over the time t $$\left( \frac{\dot\theta_{i-1}(t)}{a_{i-1}(t)} = \text{constant} \right).$$

5. The method as claimed in claim 4, characterized in that the constant is the tangent of the rotation angle (tan $\theta$) of the vector which is covered by the Hamilton operator (H(t)) in the instantaneous coordinate system.

6. The method as claimed in claim 1, characterized in that the rotation angle ($\theta$) rises monotonically from zero to a maximum value ($\theta_{max}$) over time for each transformation of the coordinate system.

7. The method as claimed in claim 1, characterized by the differential equation system which is produced being solved using a secondary condition for the physical system under consideration.

8. The method as claimed in claim 7, characterized in that the secondary condition is holonomic.

9. The method as claimed in claim 7, characterized in that the secondary condition is not holonomic.

10. The method as claimed in claim 7, characterized in that the secondary condition defines a defined movement of the tip of the vector which is covered by the Hamilton operator (H(t)) in a defined coordinate system.

11. The method as claimed in claim 10, characterized in that the movement is circular, elliptical or rectangular.

12. The method as claimed in claim 1, characterized by the type of coordinates that are used being chosen as a function of a secondary condition for the system under consideration.

13. The method as claimed in claim 12, characterized by the choice of polar coordinates, elliptical coordinates or cartesian coordinates.

14. The method as claimed in claim 1, characterized by the differential equation system which is produced being solved as an initial value problem for calculation of the parameters.

15. The method as claimed in claim 1, characterized by the differential equation system which is produced being solved as a boundary value problem for calculation of the parameters.

16. The method as claimed in claim 1, characterized by transformation of the coordinate system through a fixed offset angle (θ) between the defined Z axis of the coordinate system and the Hamilton operator (H(t)).

17. The method as claimed in claim 1 for calculation of the parameters for the Zeeman frequency, which can also be determined by linear gradient fields.

18. The method as claimed in claim 1, characterized by calculation of the parameters for frequency-modulated and/or amplitude-modulated electromagnetic pulses from two or more radiation sources.

19. The method as claimed in claim 1 for calculation of the parameters for mechanical rotation of the sample, including the orientation and the rotation frequency.

20. A computer readable medium encoded with a computer program product having program code means for carrying out the method as claimed in claim 1 when the computer program is run on a data processing processor.

21. The computer program product having program code means as claimed in claim 20, which are stored on a computer-legible data storage medium.

22. A measurement device having pulse generating means, characterized in that the pulse generating means have stored parameters for the pulses which are produced, with the parameters being calculated using the method as claimed in claim 1.

* * * * *